United States Patent [19]

Bunk et al.

[11] Patent Number: 4,483,810
[45] Date of Patent: Nov. 20, 1984

[54] METHOD FOR DIRECTLY JOINING METAL PIECES TO OXIDE-CERAMIC SUBSTRATES

[75] Inventors: Klaus Bunk, Worms; Arno Neidig, Plankstadt; Georg Wahl, Eppelheim, all of Fed. Rep. of Germany; Helmut Keser, Birr, Switzerland

[73] Assignee: Brown, Boveri and Cie AG, Mannheim, Fed. Rep. of Germany

[21] Appl. No.: 463,911

[22] Filed: Feb. 4, 1983

[30] Foreign Application Priority Data

Feb. 6, 1982 [DE] Fed. Rep. of Germany ....... 3204167

[51] Int. Cl.³ .............................................. C04B 39/00
[52] U.S. Cl. ...................................... 264/60; 264/61; 264/62; 264/65
[58] Field of Search .......................... 264/60, 62, 61, 65

[56] References Cited

U.S. PATENT DOCUMENTS 4,340,436 7/1982 Dubetsky .............................. 264/61

FOREIGN PATENT DOCUMENTS 2319854 10/1973 Fed. Rep. of Germany .
2508224 9/1975 Fed. Rep. of Germany .
2633869 2/1977 Fed. Rep. of Germany .
761045 11/1956 United Kingdom .

Primary Examiner—John A. Parrish
Attorney, Agent, or Firm—Herbert L Lerner; Laurence A. Greenberg

[57] ABSTRACT

Method for the direct joining of metal pieces which have a surface metal oxide layer, to oxide ceramic substrates by heating the ceramic substrates covered with the metal pieces in an oxygen-containing atmosphere to a temperature above the eutectic temperature of the metal and the metal oxide, but below the melting temperature of the metal. The heating is carried out in a continuous heating furnace in a nitrogen atmosphere with an addition of oxygen of 20 to 50 vpm. The cooling-down in the continuous heating furnace takes place after the solidification of the eutectic melt, in a nitrogen atmosphere which has an oxygen content well below the 20 vpm.

15 Claims, 2 Drawing Figures

METHOD FOR DIRECTLY JOINING METAL PIECES TO OXIDE-CERAMIC SUBSTRATES

BACKGROUND OF THE INVENTION

1. Field of the Invention

The invention relates to a method for the direct joining of metal pieces to oxide-ceramic by heating the ceramic substrates covered with metal pieces in an oxygen-containing atmosphere to a temperature above the eutetic temperature of the metal and the oxide, but below the melting point of the metal.

2. Description of the Prior Art

German Published Non-Prosecuted Application DE-OS No. 25 08 224 discloses a method of this type. In this method, preoxidized metal is used so as to make possible adhesion between the metal and the ceramic at all points as well as in joints with a large area. In addition, the metal piece is pre-bent so that it makes contact only gradually with ceramic substrate during the heating process. Thereby, possible gas bubbles between the metal and the ceramic are supposed to be pushed out to the outside. This method, however, is cumbersome and expensive; also, if the metal piece and/or the ceramic substrate are preformed in a complicated manner, bending of the metal piece is not always possible, or the metal piece does not follow the substrate sufficiently uniformly. In addition, the exposed metal surface is coated during the heating with an oxide layer which must later be removed, considering the reactive atmosphere of 0.01 to 0.5 volume-% oxygen (remainder nitrogen) that must be used.

German Published Non-Prosecuted Application DE-OS No. 26 33 869 describes a method in which a metal foil, preferably of copper, is first oxidized, whereupon the metal foil with the oxide layer is brought into contact with an oxide-ceramic substrate, preferably of aluminum or beryllium oxide. Thereupon, the metal foil and the substrate are heated in an inert atmosphere at a temperature between the eutectic temperature of copper and copper oxide and the melting temperature of copper until an undereutectic melt has been formed between copper and the substrate. Heating in an inert atmosphere, however, does not lead to the desired strongly adhering joint between copper and ceramic because, at the process temperatures indicated, CuO is reduced to $Cu_2O$, and $Cu_2O$ is reduced to Cu unless a certain minimum partial oxygen pressure is maintained in the ambient atmosphere. Reduced Cu, however, does not form a bond with the ceramic.

German Published non-Prosecuted Application DE-OS No. 26 33 869, proposed to use an oxygen-containing copper material without oxide coating in lieu of preoxidized copper. Apart from the fact that here also, no bond between copper and ceramic can be produced unless a minimum partial oxygen pressure is maintained in the oven atmosphere, it has been found in tests that the oxygen dissolved in the metal diffuses to the contact surface between copper and ceramic and remains occluded there, which leads to the formation of gas bubbles and thereby to a defective bond between the metal and the ceramic.

From German Published Non-Prosecuted Application DE-OS No. 23 19 854, a further method for directly joining metals to non-metallic substrates is known which differs from the just-described method by the provision that a bare, non-preoxidized metal foil, particularly of copper, is to be joined to the oxide ceramic substrate in a reactive, particularly oxygen-containing atmosphere. In this method, the oxygen in the atmosphere must first oxidize the copper superficially before the bonding process proper can proceed. However, it has been found that, particularly in the case of joints with a large area between ceramic and copper, the oxygen cannot penetrate in sufficient quantity into the gap between the ceramic and the copper, so that bubble-like places without adhesion are produced. In addition, the copper foil is coated on the side facing away from the ceramic substrate with a thick black copper oxide layer if the amounts of oxygen of 0.01 to 0.5 volume-% are present as indicated. This copper oxide layer must be removed in an additional operation before further processing is possible, particularly for use in the semiconductor industry. To use an oxygen content of less than 0.01 volume-% is expressly discouraged since then no bond between the copper and the ceramic is supposed to be produced.

From British Pat. No. 761,045 a method is likewise known for the direct joining of copper to ceramic. There, a large number of process variants is described in which the oven atmosphere has at least at times, an oxidizing and at least at times a reducing pressure. Heating in a vacuum is also proposed. It is a common feature of all process variants that the joining of copper and ceramic is to take place in a temperature range of 1083° C. to 1235° C., i.e. above the melting temperature of copper and below the melting temperature of copper oxide. The formation of excessively thick oxide layers on the exposed copper surfaces is to be prevented here by masking with a protective material such as aluminum oxide or silver. The application and subsequent removal of the protective material, however, necessitates additional process steps. Furthermore, the necessary temperature range is very high in a disadvantageous manner.

SUMMARY OF THE INVENTION

It is an object of the invention to provide an improved method for the direct joining of metal pieces to oxide-ceramic substrates, in which a substantially bubble-free joint between the metal pieces and the ceramic substrates and at the same time an oxide-free metal surface is obtained in a simple manner.

With the foregoing and other objects in view, there is provided in accordance with the invention a method for the direct joining of metal pieces to ceramic oxide substrates which comprises covering the ceramic substrate with a metal piece having an oxide coating on the side facing the ceramic substrate, heating the substrate covered by the metal piece with an oxide coating to a temperature above the eutectic temperature of the metal and the oxide but below the melting point of the metal to form a eutectic melt in an atmosphere of an inert gas and 20 to 50 volume parts per million oxygen, reducing the temperature to cool and solidify the eutectic melt and after solidification of the eutectic melt continuing cooling while maintaining the ceramic substrate with the covering metal piece in an atmosphere of an inert gas in the absence of oxygen.

Other features which are considered as characteristic for the invention are set forth in the appended claims.

Although the invention is illustrated and described herein as embodied in a method for directly joining metal pieces to oxideceramic substrates, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with accompanying drawings, in which.

DETAILED DESCRIPTION OF THE INVENTION

In one embodiment of the invention, metal pieces are directly joined to ceramic oxide substrates by placing the metal piece having a metal oxide layer on its surface on the ceramic oxide substrate and heating them in an oxygen-containing atmosphere to a temperature above the eutectic temperature of the metal and the metal oxide, but below the melting temperature of the metal. The heating is carried out in a continuous heating furnace in a nitrogen atmosphere with an addition of 20 to 50 vpm (parts per million by volume). The cooling down in the continuous heating furnace takes place after the solidification of the eutectic melt in a nitrogen atmosphere without oxygen.

The advantages attainable with the invention are in particular that an oxide-free metal surface is obtained merely by suitable management of the process and without later reduction steps. The method is further adaptable for economical mass production. Postprocessing of the composite metal-ceramic systems taken from the continuous furnace for further processing is not necessary. Before heating to form an eutectic, the metal pieces, preferably copper sheets, are provided with an oxide layer which may be a thin layer. In practice, it was found that a thickness of the oxide of approximately 1/10 of the surface roughness of the ceramic substrate used, for instance aluminum oxide ceramic, gave good results. The oxidation is preferably carried out chemically in known manner. The copper sheets may be oxidized on one or both sides and are placed on the ceramic substrates with their oxidized side. For compensating the bending and bulging due to thermal stresses because of the different thermal expansion of copper and ceramic, copper sheets may be provided on both sides of the ceramic substrates.

The copper sheets are preferably made of oxygen-free copper. Burrs at the cutting edges of flat copper sheets should advantageously be avoided, otherwise, sufficiently close contact between the oxidized copper sheets and the ceramic substrates may not come about. The ceramic may be made of aluminum oxide or beryllium oxide, preferably aluminum oxide.

Figure 1:
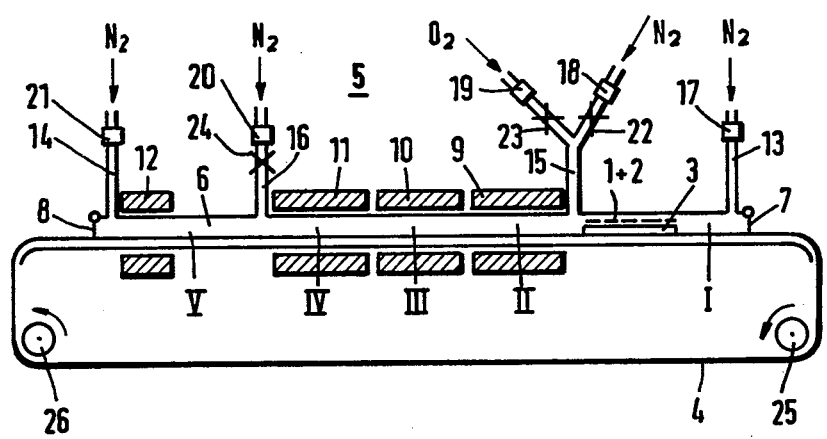
FIG. 1 diagrammatically illustrates a continuous furnace suitable for carrying out the method according to the invention. The furnace is equipped with an endless moving chain which continuously transports the substrate covered by copper covered sheets placed on silicon carbide carrier through a furnace enclosure. The enclosure has five zones, a preheating or heating-up zone at the entrance, three central heating zones and a cooling zone before the exit. Control of the atmosphere in the enclosure is obtained by introducing nitrogen at spaced points and oxygen at one point.

As shown in FIG. 1, the substrates 2 provided with copper sheets 1 are placed flat on a carrier 3, preferably of silicon carbide or a graphite core with a silicon carbide coating. The carrier 3 is placed on the transport chain 4 of a continuous heating furnace 5.

The continuous heating furnace 5 has a tunnel (metal shaft) 6, open on both sides. In the tunnel 6, there are substantially five spatially distributed temperature zones, namely a preheating or heating-up zone I in the entrance part, three heating zones II, III, IV in the central part and a cooling-down zone V in the exit part of the tunnel. Both open ends of the tunnel 6 are provided with movably attached, not gas-tight locks, metal flaps 7 and 8. The central portion of the tunnel 6 is enclosed by three heating elements 9, 10 and 11 for creating the heating zones II, III, IV. At its end section on the exit side, the tunnel has a cooling element 12 surrounding its walls. The temperature values in the tunnel interior which can be kept constant by means of the three heating elements 10, 11 and 12, can be set independently of each other and are controlled with an accuracy of 1° to 2° C.

The tunnel 6 has further at both its ends gas inlet nipples 13 and 14. Further gas inlet nipples 15 and 16, respectively, are located ahead of the first heating element 9 and after the third heating element 11. The gas inlet nipple 15 is forked and ends in two gas feed-lines. Flow meters 17, 20, 21 are provided at the gas inlet nipples 13, 16, 14 for adjusting the gas volume flows accurately. Other flow meters 18 and 19 are arranged in line with the two gas feed-lines to the gas inlet nipple 15. These two gas feed-lines have additional control valves 22 and 23 for accurately controlling the predetermined volume streams. A control valve 24 is also provided for the gas inlet nipple 16. The endless transport chain 4 of the continuous feeding furnace 5 is driven via rolls 25 and 26. The carrier 3 located on the chain 4 ahead of the tunnel entrance is transported through the lock 7 which opens into the heating zone I in the entrance part of the interior of the tunnel. Nitrogen is blown through the gas inlet nipple 13, which is arranged in the tunnel behind the lock 7. This nitrogen from nipple 13 forms a gas veil and thereby prevents oxygen-rich ambient air (particularly when the lock 7 is opened) from penetrating into the interior of the tunnel.

The substrates 2 covered with copper sheets 1 traverse, lying on the carrier 3, the preheating zone I as well as the heating zone II in about 20 minutes. The central section of the heating zone II is controlled approximately to a temperature value T=960° C. When entering the central section of the heating zone III, the parts to be joined reach a temperature between the eutectic temperature (1065° C.) of copper and copper oxide and the melting temperature (1083° C.) of copper i.e. preferably a temperature peak value of 1070° C. to 1072° C., and a eutectic melt is formed between the copper sheet 1 and the ceramic substrate 2.

The substrates covered with copper remain in this high-temperature reaction zone for about 1 to 2 minutes during the traversing of the furnace. In the interior of the tunnel, a nitrogen atmosphere with the addition of 20 to 50 vpm oxygen prevails in the heating zones II and III. The predetermined nitrogen/oxygen mixture is continuously blown through the gas inlet nipple 15 to maintain this atmosphere. Flow meter 19/control valve 23 for the oxygen feed and flow meter 18/control valve 22 for the nitrogen feed are provided as the means of controls.

The gas mixture, due to the turbulence, is distributed uniformly in the zones I, II, III and leaves the tunnel 6 via the lock 7.

After the joining process is completed, i.e. after the solidification of the eutectic melt, the carrier 3 travelling through on the chain 4 passes from the heating zone III into the heating zone IV of the tunnel 6. It should be remembered that solidification of the eutectic melt does not take place instantaneously and the joining process is not completed until the temperature drops well below the eutectic, usually a drop of 100° C. or less will safely assure the joining. This can be accomplished in about a minute or two. The composite metal-ceramic systems are cooled down to about 960° C. in the central section of the heating zone IV. The time of travel of the substrates covered with copper through heating zones II, III and IV is a matter of minutes generally less than about 10 minutes. It is desirable to keep this high temperature heating time short to avoid extensive oxidation of the copper. In these zones there is oxygen in the atmosphere except near the exit of zone IV where there is a transition to an inert atmosphere (well below the 20 vpm) due to the introduction of a nitrogen at the exit of zone IV. The temperature at the exit of zone IV is of the order 900° C. In order to prevent further oxidation it is desirable to continue the cooling down in an inert atmosphere, i.e. substantially free of oxygen. The cooling-down of the composite metal-ceramic system at the end of heating zone IV and in the subsequent cooling-down zone V proper takes place in a nitrogen atmosphere substantially free of oxygen, i.e. well below 20 vpm. If copper sheets 1 oxidized on both sides are used, the copper surface is reduced in the process. The nitrogen atmosphere is obtained by blowing pure nitrogen into the interior of the tunnel via the gas inlet nipple 16. Because of the turbulence the nitrogen is distributed uniformly in the zones IV and V and leaves the tunnel 6 via the lock 8.

Through special nozzle arrangements or shapes at the gas inlet nipples 15 and 16 as well as by corresponding adjustment of the volume streams through both inlet nipples, a relatively sharp boundary between the nitrogen/oxygen atmosphere in the zones I, II and III and the pure nitrogen atmosphere in the zones IV and V can be adjusted in the tunnel interior without additional locks.

The entire cooling-down process takes about 20 minutes. The cooling element 12 at the end of the tunnel which is, for instance, water cooled, serves to accelerate cooling-down of the composite metal/ceramic system. Nitrogen is blown-in through the gas inlet nipple 14 in order to form a gas veil, which prevents ambient air from penetrating into the interior of the tunnel (particularly when the lock 8 is opened). When leaving the continuous heating furnace 5 through the lock 8, the composite metal/ceramic systems have been cooled down to room temperature. The copper surfaces are metallically bare and so there is practically no subsequent oxidation. A possible oxide content is so small that it can be removed easily by conventional fluxes in a subsequent soldering operation. The adhesion of the copper to the ceramic is largely free of bubbles and so good that in pull-off tests, parts of the ceramic are torn off together with the copper.

Figure 2:
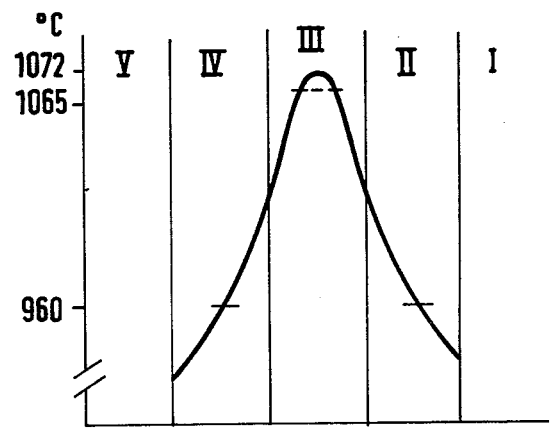
FIG. 2 shows a temperature profile in carrying out a method in accordance with the invention.

FIG. 2 shows the temperature profile in the individual zones of the continuous heating furnace 5. The temperature axis shows only the upper temperature range from about 960° C. to 1072° C. The relatively steeply rising or falling temperature profile in the heating zones II, III, IV, particularly can be seen in FIG. 2. The temperature range above 1065° C. which is important for producing the eutectic melt, is reached only in the central section of the heating zone III. The drop of the temperature profile on both sides of the maximum temperature of 1072° C. to the temperatures of T=960° C. prearranged in the center parts of the heating zone II and IV is steep, i.e. the heating and cooling of the composite metal/ceramic systems takes place very quickly in the temperature range of 960° C. to 1072° C. By this process management (in conjunction with the nitrogen/oxygen atmosphere indicated), particularly, the substantially bubble-free composite metal/ceramic systems with a bare metal surface are obtained.

We claim:

1. A method for the direct joining of metal pieces to ceramic oxide substrates which comprises covering the ceramic substrate with a metal piece having an oxide coating on the side facing the ceramic substrate, heating the substrate covered by the metal piece with an oxide coating to a temperature above the eutectic temperature of the metal and the oxide but below the melting point of the metal to form a eutectic melt in an atmosphere of an inert gas and 20 to 50 volume parts per million oxygen, reducing the temperature to cool and solidify the eutectic melt and after solidification of the eutectic melt continuing cooling while maintaining the ceramic substrate with covering metal piece in an atmosphere of an inert gas in the absence of oxygen.

2. Method according to claim 1, wherein the inert gas is nitrogen.

3. Method according to claim 1, wherein the metal pieces are copper sheets.

4. Method according to claim 1, wherein the substrate covered by the metal pieces is heated from a temperature of 960° C. to above said eutectic temperature and reduced in temperature to 960° C. in a period of less than about four minutes.

5. Method according to claim 3, wherein the substrate covered by the metal pieces is heated from a temperature of 960° C. to above said eutectic temperature and reduced in temperature to 960° C. in a period of less than about four minutes.

6. Method according to claim 1, wherein the atmosphere containing an inert gas with 20–50 vpm oxygen around the metal covered ceramic substrate after the eutectic melt has solidified is changed to an inert gas before the temperature is further reduced to below 900° C.

7. Method according to claim 2, wherein the atmosphere containing an inert gas with 20–50 vpm oxygen around the metal covered ceramic substrate after the eutectic melt has solidified is changed to an inert gas before the temperature is further reduced to below 900° C.

8. Method according to claim 3, wherein the atmosphere containing an inert gas with 20–50 vpm oxygen around the metal covered ceramic substrate after the eutectic melt has solidified is changed to an inert gas before the temperature is further reduced to below 900° C.

9. Method according to claim 1, wherein the atmosphere around the metal covered ceramic substrate is controlled by the introduction into said atmosphere of oxygen and inert gas at spaced points in amounts regulated to maintain the desired oxygen concentration.

10. Method according to claim 2, wherein the atmosphere around the metal covered ceramic substrate is controlled by the introduction into said atmosphere of oxygen and inert gas at spaced points in amounts regulated to maintain the desired oxygen concentration.

11. Method according to claim 3, wherein the atmosphere around the metal covered ceramic substrate is controlled by the introduction into said atmosphere of oxygen and inert gas at spaced points in amounts regulated to maintain the desired oxygen concentration.

12. Method according to claim 1, wherein the metal covered ceramic substrate is conveyed through a continuous heating furnace having a tunnel enclosure with a first entrance preheating zone, a second, a third and a fourth heating zones in which said substrate is rapidly heated above the eutectic to form a eutectic melt and reduced in temperature to solidify the eutectic melt and a fifth exit cooling zone to further cool said substrate, flaps and nitrogen inlets at both ends of the tunnel to prevent ambient air from entering the tunnel, a nitrogen inlet and an oxygen inlet at the entrance of the second heating zone to provide an atmosphere of desired oxygen concentration in the heating zones, and a nitrogen inlet at the outlet of the fourth heating zone to provide a nitrogen atmosphere without significant oxygen content in the fifth cooling zone.

13. Method according to claim 1, wherein the ceramic oxide is aluminum oxide.

14. Method according to claim 2, wherein the ceramic oxide is aluminum oxide.

15. Method according to claim 3, wherein the ceramic oxide is aluminum oxide.

* * * * *